(12) United States Patent
Doczy et al.

(10) Patent No.: US 6,972,225 B2
(45) Date of Patent: Dec. 6, 2005

(54) INTEGRATING N-TYPE AND P-TYPE METAL GATE TRANSISTORS

(75) Inventors: Mark Doczy, Beaverton, OR (US); Justin K. Brask, Portland, OR (US); Steven J. Keating, Beaverton, OR (US); Chris E. Barns, Portland, OR (US); Brian S. Doyle, Portland, OR (US); Michael L. McSwiney, Hillsboro, OR (US); Jack T. Kavalieros, Portland, OR (US); John P. Barnak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/946,502

(22) Filed: Sep. 20, 2004

(65) Prior Publication Data

US 2005/0040469 A1 Feb. 24, 2005

Related U.S. Application Data

(63) Continuation of application No. 10/327,293, filed on Dec. 20, 2002, now Pat. No. 6,858,483.

(51) Int. Cl.[7] .......................................... H01L 21/8238
(52) U.S. Cl. ...................... 438/199; 438/275; 438/585; 438/926
(58) Field of Search ............................... 438/199, 233, 438/585, 926, 275, FOR 187, FOR 216, 438/FOR 238

(56) References Cited

U.S. PATENT DOCUMENTS

| 6,107,126 A | 8/2000 | Wu .............................. 438/217 |
| 6,204,137 B1 * | 3/2001 | Teo et al. .................... 438/305 |
| 6,255,698 B1 | 7/2001 | Gardner et al. |
| 6,365,450 B1 | 4/2002 | Kim |
| 6,387,743 B1 * | 5/2002 | Shiozawa et al. ........... 438/199 |
| 6,410,376 B1 | 6/2002 | Ng et al. |
| 6,541,395 B1 | 4/2003 | Trivedi et al. ............... 438/775 |
| 6,586,288 B2 | 7/2003 | Kim et al. |
| 6,620,664 B2 | 9/2003 | Ma et al. ..................... 438/183 |
| 6,642,131 B2 | 11/2003 | Harada ....................... 438/591 |
| 6,667,246 B2 | 12/2003 | Mitsuhashi et al. ......... 438/756 |
| 2002/0058374 A1 | 5/2002 | Kim et al. |

FOREIGN PATENT DOCUMENTS

| EP | 0 899 784 A2 | 3/1999 |
| GB | 2 358 737 A | 1/2001 | ......... H01L 27/092 |
| GB | 2 358 737 | 8/2001 |

* cited by examiner

Primary Examiner—George Fourson
Assistant Examiner—Michelle Estrada
(74) Attorney, Agent, or Firm—Blakely, Sokoloff, Taylor & Zafman LLP

(57) ABSTRACT

At least a p-type and n-type semiconductor device deposited upon a semiconductor wafer containing metal or metal alloy gates. More particularly, a complementary metal-oxide-semiconductor (CMOS) device is formed on a semiconductor wafer having n-type and p-type metal gates.

19 Claims, 6 Drawing Sheets

INTEGRATING N-TYPE AND P-TYPE METAL GATE TRANSISTORS

This is a Continuation application of Ser. No. 10/327,293 filed Dec. 20, 2002, now U.S. Pat. No. 6,858,483.

FIELD

Embodiments of the invention relate to the manufacturing of complementary metal-oxide-semiconductor (CMOS) devices. More particularly, embodiments of the invention relate to integrating n-type and p-type metal gate transistors within a single CMOS device.

BACKGROUND

Prior art CMOS devices manufactured with prior art semiconductor processes typically have polysilicon gate structures. Polysilicon, however, can be susceptible to depletion effects, which can add to the overall gate dielectric thickness in the CMOS device. Furthermore, as the effective physical gate dielectric thickness decreases, the polysilicon depletion contributes proportionally to the total dielectric thickness. It is, therefore, desirable to eliminate polysilicon depletion in order to scale gate oxide thickness.

Metal gates, on the other hand, are not as susceptible to depletion as polysilicon and are in many ways preferable to polysilicon for forming gate structures. Typical prior art semiconductor processes, however, do not incorporate n-type and p-type metal gates within the same device or integrated circuit. This is due, in part, to the complexity and cost of developing a semiconductor process that can reliably deposit metal gate structures of differing types into the same semiconductor device or integrated circuit.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

Embodiments of the invention described herein relate to semiconductor manufacturing. More particularly, embodiments of the invention described relate to integrating n-type and p-type metal gate transistors within the same complementary metal-oxide-semiconductor (CMOS) device or integrated circuit.

In order to manufacture CMOS devices and integrated circuits that can avoid the effects of gate depletion, embodiments of the invention incorporate n-type and p-type metal gates into the same CMOS device or integrated circuits.

Figure 1:
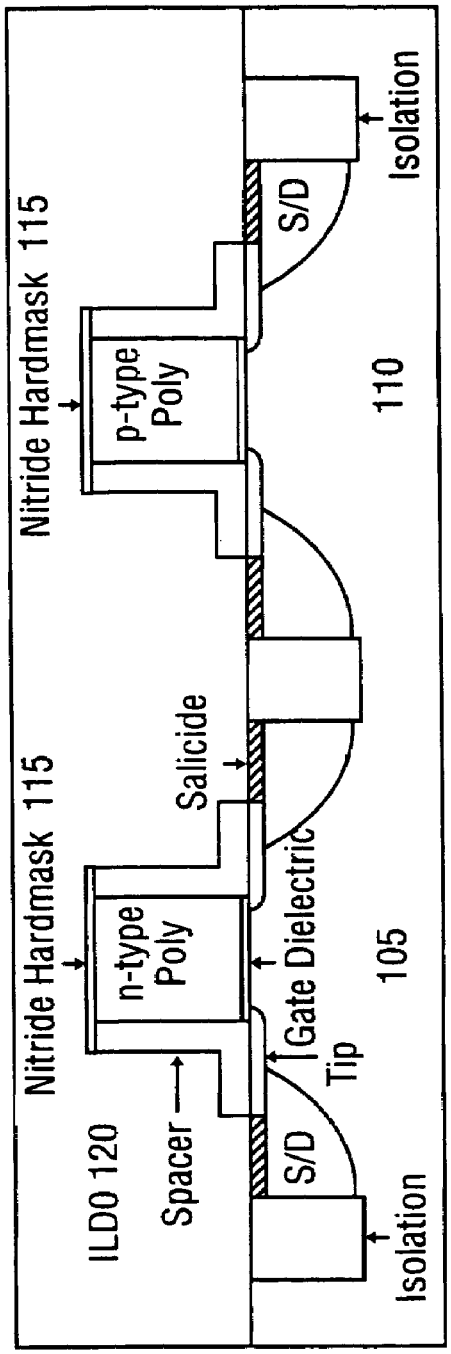
FIG. 1 illustrates the state of transistors after depositing ILD0 according to one embodiment.

FIG. 1 illustrates a cross-section of a CMOS device containing a p-type transistor and an n-type transistor after depositing ILD0 ("Inter-layer dielectric") according to one embodiment. In FIG. 1, poly-silicon gate transistors 105, 110 are fabricated using standard CMOS processing techniques in order to prevent silicide formation on the polysilicon gate electrode. The nitride hard masks 115 are to protect the gate structures during silicidation and ILD0 120 is deposited on the structure.

Figure 2:
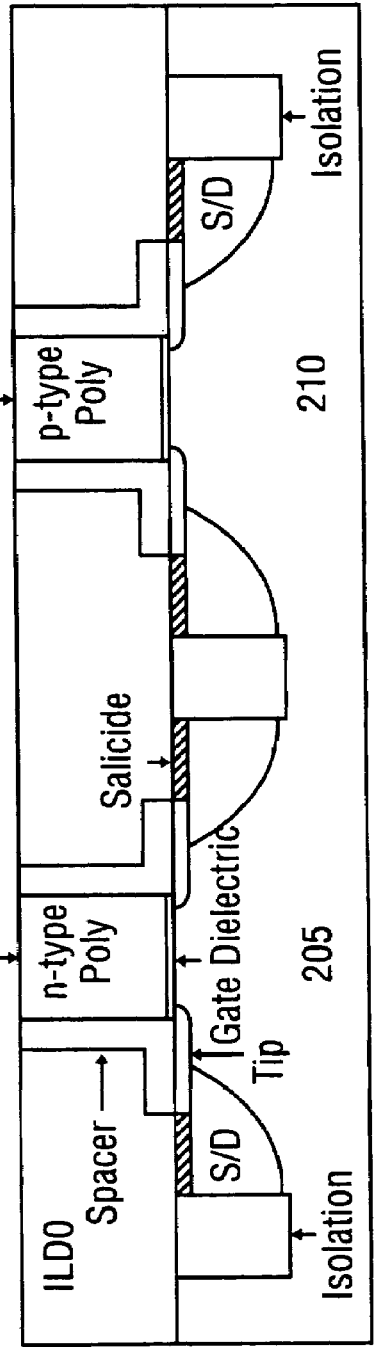
FIG. 2 illustrates the state of transistors after ILD0 polish-back to expose polysilicon gate structures according to one embodiment.
Figure 3:
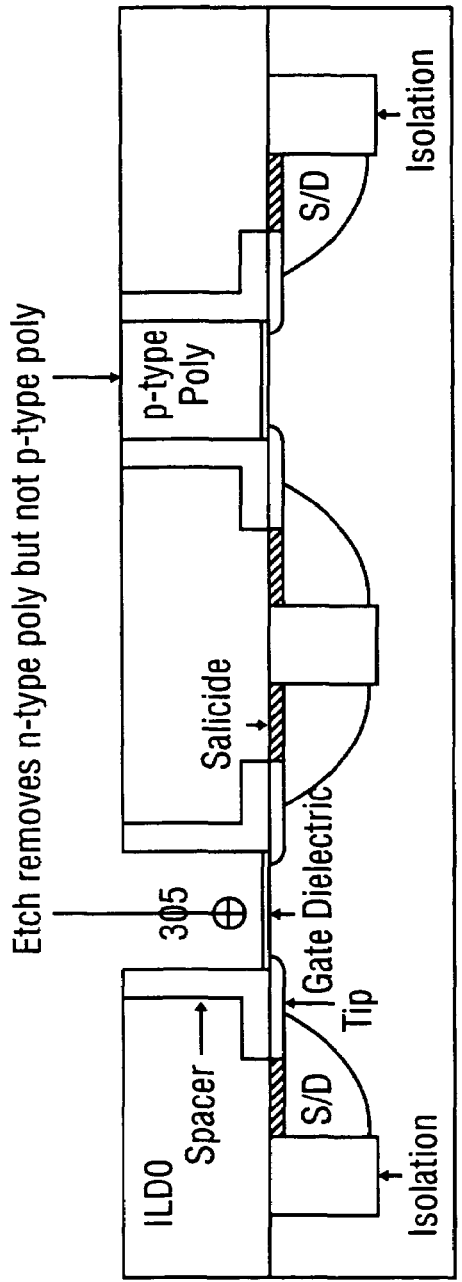
FIG. 3 illustrates the state of transistors after selective n-type poly etch according to one embodiment.

The ILD0 is polished back to expose the doped polysilicon gates in FIG. 2. The ILD0 polishing also removes residual silicide around the nitride masking layer. After the polysilicon gates 205, 210 are exposed, an ammonium hydroxide etch is used to selectively etch away 305 the n-type polysilicon. The ammonium hydroxide etch is low temperature (e.g., <40 deg. Celsius), uses sonication, and has a concentration of approximately 2–29%. The result of the polysilicon etch is illustrated in FIG. 3.

Figure 4:
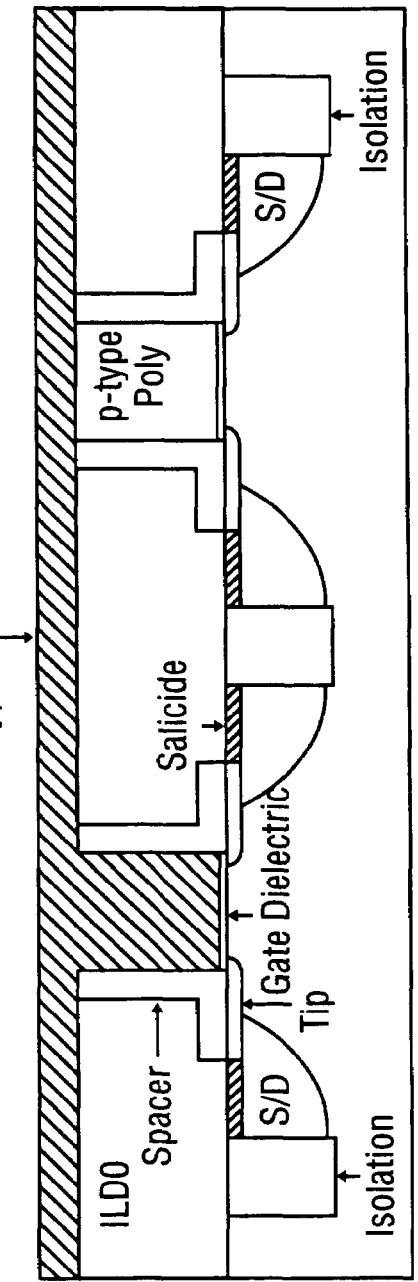
FIG. 4 illustrates the state of transistors after depositing n-type metal according to one embodiment.

Removal of the p-type polysilicon above the gate dielectric creates a damascene-like "trench" which is filled with an n-type metal 405, such as Hf, Zr, Ti, Ta, or Al, as illustrated in FIG. 4. Alternatively, the trench can be filled with an alloy containing an n-type component using PVD ("Physical vapor deposition"), CVD ("Chemical vapor deposition"), or ALD ("Atomic Layer deposition"). CVD and ALD may use an organometallic or halide precursor, and a reducing atmosphere. Furthermore, the thickness of the n-type metal or alloy can be such that the trench is only partially filled. For example, the thickness of the n-type metal or alloy can vary from approximately 50 angstroms to approximately 1000 angstroms in various embodiments. If the trenches are not completely filled, they may be filled with an easily polished metal, such as W ("Tungsten") or Al ("Aluminum").

Figure 5:
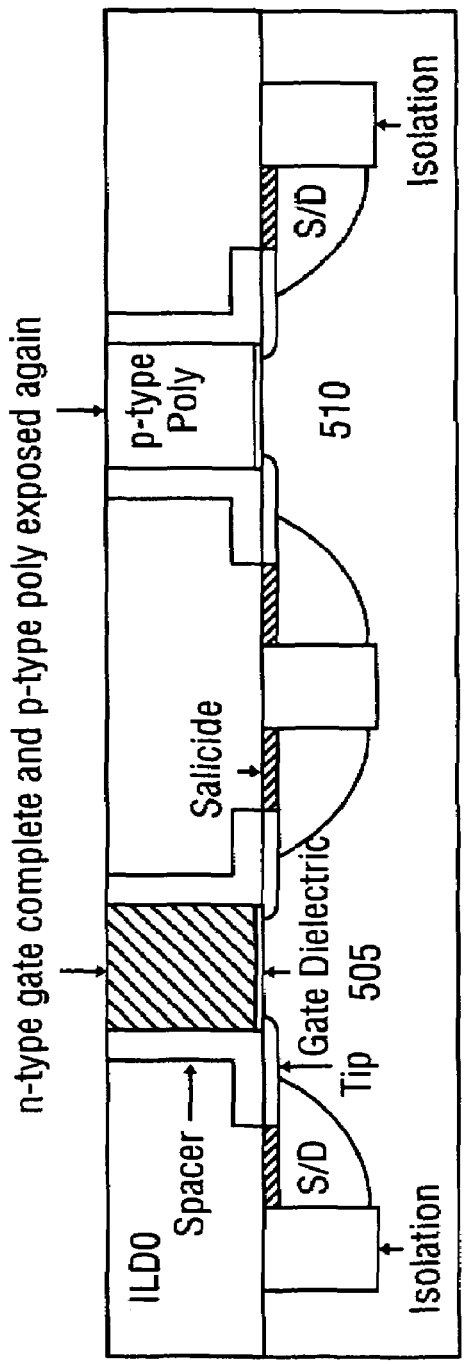
FIG. 5 illustrates the state of transistors after polishing the n-type metal according to one embodiment.

The n-type metal is polished back to create the n-type metal gates 505 and to expose the p-type polysilicon gate 510 as illustrated in FIG. 5.

Figure 6:
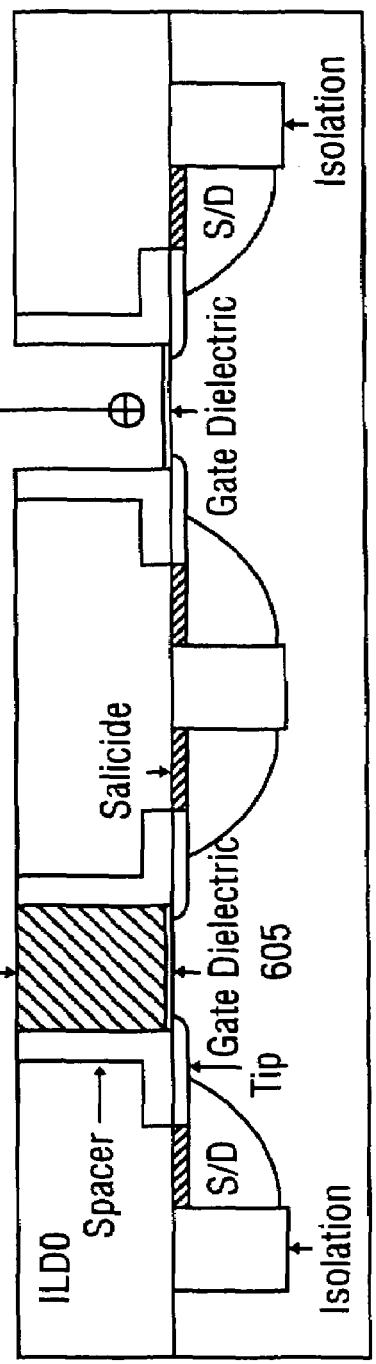
FIG. 6 illustrates the state of transistors after selectively etching p-type polysilicon according to one embodiment.

FIG. 6 illustrates the transistors after a selective dry etch is performed to remove the p-type polysilicon without removing the n-type metal gate. The selective dry etch can be performed using a parallel plate or ECR ("Electron cyclotron resonance") etcher and SF6 ("Sulfur hexafluoride"), HBr ("Hydrogen Bromide"), HI ("Hydrogen Iodide"), Cl2 ("Chlorine"), Ar ("Argon"), and/or He ("Helium"). Alternatively, a wet etch, such as approximately 20–30% TMAH ("Tetramethylammonium Hydroxide") at approximately 60–90 degrees Celsius with or without sonication may also be used to remove the p-type polysilicon gate.

Figure 7:
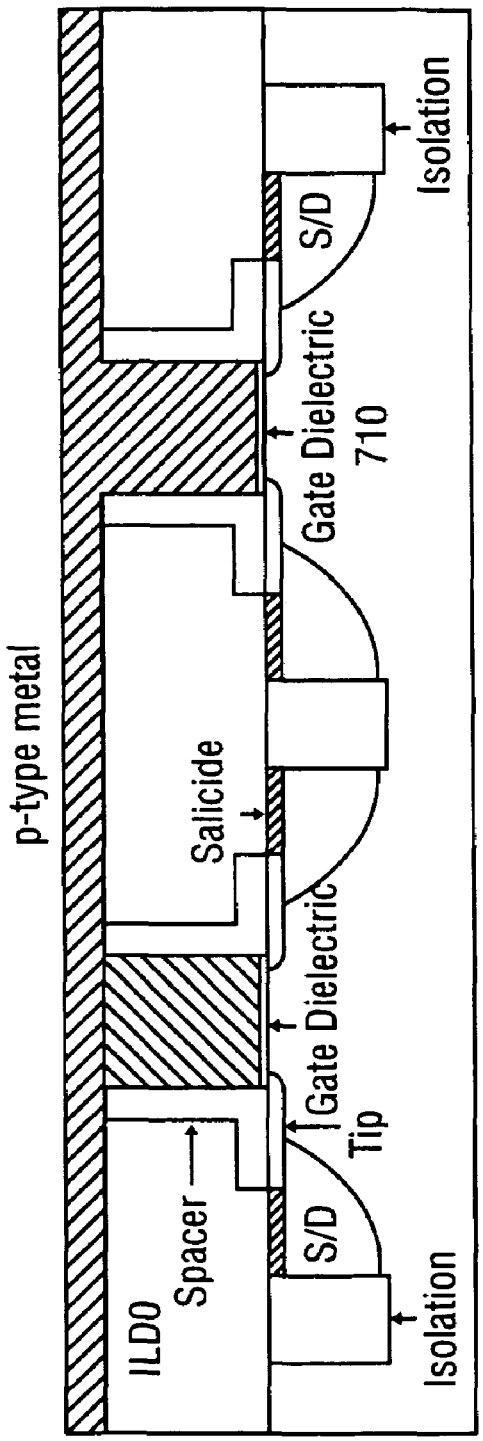
FIG. 7 illustrates the state of transistors after depositing p-type metal according to one embodiment.

A p-type metal, such as Ru ("Ruthenium"), Pd ("Palladium"), Pt ("Platinum"), Co ("Cobalt"), Ni ("Nickel"), TiAlN ("Titanium Aluminum Nitride"), or WCN ("Tungsten Carbon Nitride") can be used to fill the gate trench created by etching the p-type polysilicon gate 605. Alternatively, an alloy using p-type metal can be deposited in the trench using chemical vapor deposition or atomic layer deposition with an organometallic precursor and a reducing atmosphere. Furthermore, the thickness of the p-type metal or alloy can be such that the trench is only partially filled. FIG. 7 illustrates the transistors after the p-type metal or alloy has been deposited in the gate trench 710.

Figure 8:
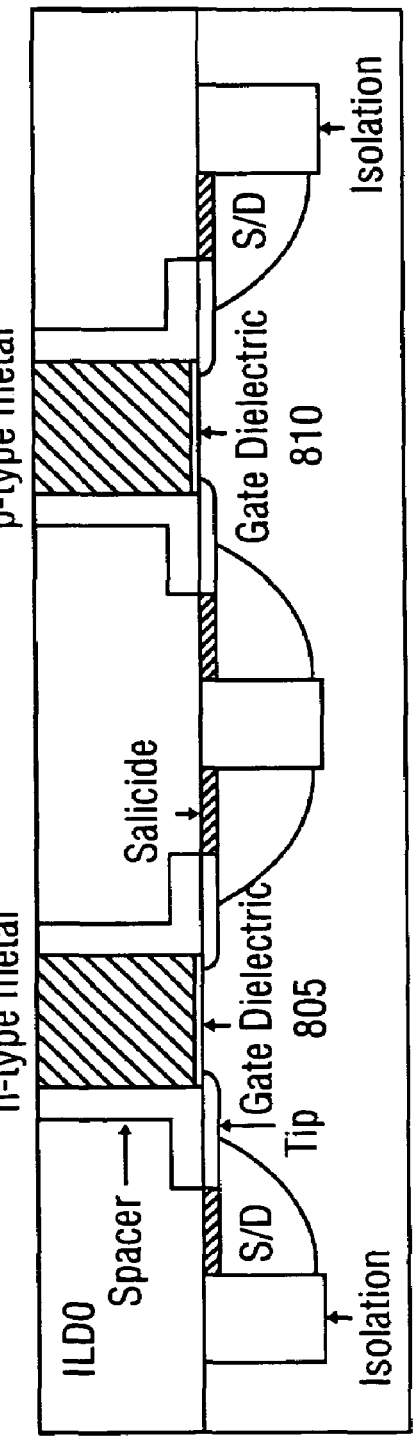
FIG. 8 illustrates the state of transistors after polishing the p-type metal according to one embodiment.

The p-type metal or alloy is polished back, as illustrated in FIG. 8, to create the p-type gate structures 805, 810, and ILD0 is again deposited to provide room for the contact layer.

Figure 9:
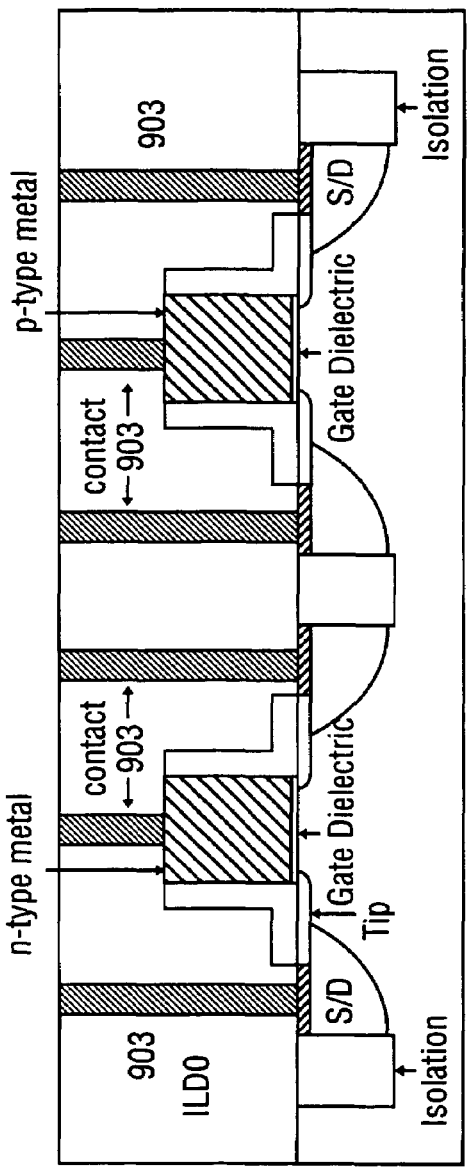
FIG. 9 illustrates the completed transistors according to one embodiment.

Contacts 903 are etched and deposited, as illustrated in FIG. 9, resulting in the final transistor structure.

Figure 10:
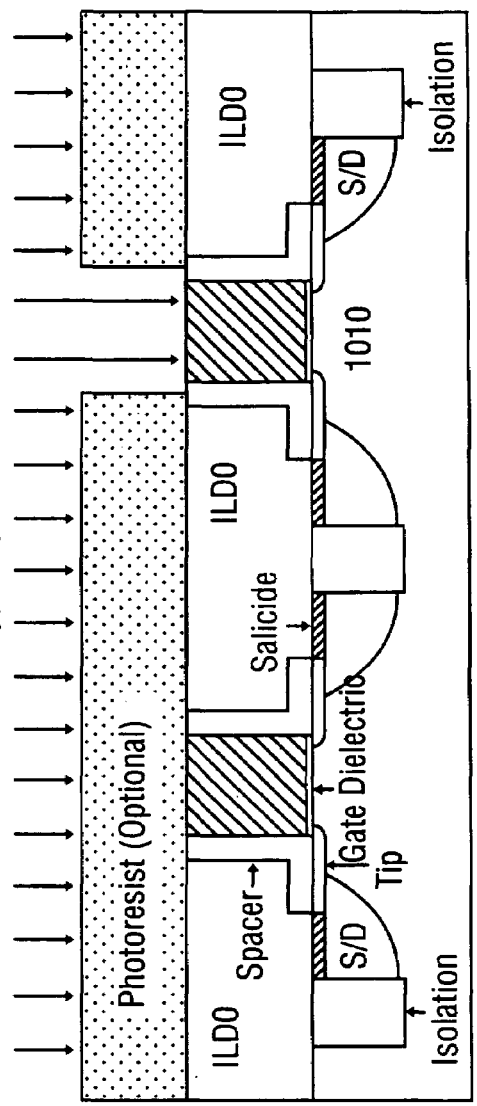
FIG. 10 illustrates the state of transistors after an optional implant patterning according to one embodiment.

Rather than using a dry etch to remove the p-type polysilicon as described above, the p-type polysilicon gate can be converted to n-type in order to allow a gentler wet etch to remove the polysilicon rather than a dry etch. For example, after the p-type polysilicon 1010 has been exposed, rather than using a selective dry etch to remove the polysilicon, an n-type implant 1015 is performed to change the doping of the polysilicon in order to allow an ammonium hydroxide etch to be performed, as illustrated in FIG. 10.

Figure 11:
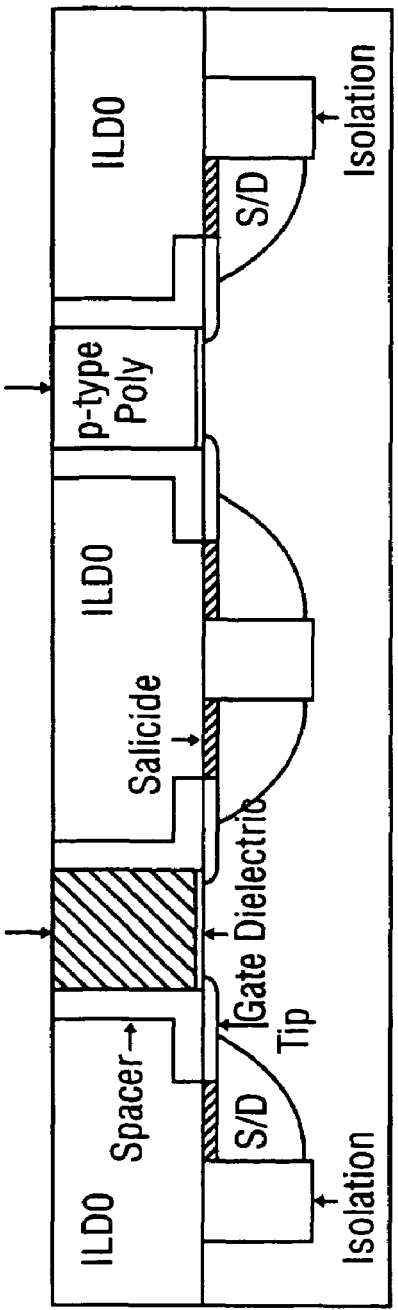
FIG. 11 illustrates the state of transistors after n-type implant and optional ash.
Figure 12:
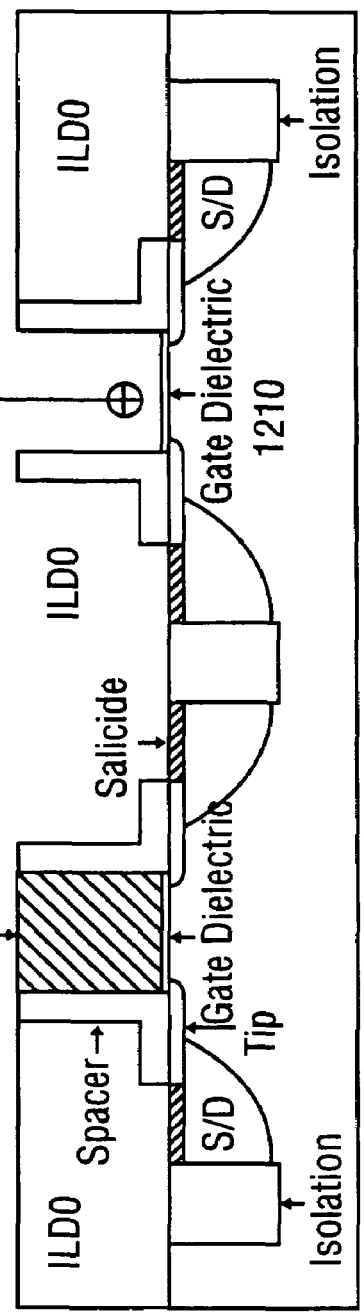
FIG. 12 illustrates the state of transistors after a second selective n-type polysilicon etch.

The result of the implant and ash (if required) is illustrated in FIG. 11. An ammonium hydroxide etch removes the remaining polysilicon gate structure 1210 resulting in the structure illustrated in FIG. 12. A p-type metal or alloy may then be deposited in the trench left by removing the p-type polysilicon gate as described above.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A method comprising:
    forming exposed first and second structures on first and second parts of a substrate;
    removing the exposed first structure selectively to the exposed second structure to generate a first trench without masking the exposed second structure;
    forming a first metal gate electrode within the first trench;
    removing the exposed second structure to generate a second trench; and
    forming a second metal gate electrode within the second trench.

2. The method of claim 1 wherein:
    the exposed first and second structures each comprise polysilicon;
    the first metal gate electrode comprises a first metal that fills the first trench and that is selected from the group consisting of Hf, Zr, Ti, Ta, and Al; and
    the second metal gate electrode comprises a second metal that fills the second trench and that is selected from the group consisting of Ru, Pd, Pt, Co, Ni, TiAlN, and WCN.

3. The method of claim 2 wherein:
    the exposed first structure comprises n-type polysilicon;
    the exposed second structure comprises p-type polysilicon; and
    the exposed first structure is removed selectively to the exposed second structure using an ammonium hydroxide etch.

4. The method of claim 3 wherein the ammonium hydroxide etch takes place below 40° C. and at a concentration of 2–29%.

5. The method of claim 4 wherein the exposed second structure is removed using a wet etch that comprises 20–30% TMAH at 60–90° C.

6. The method of claim 5 wherein sonication is used to remove the exposed first and second structures.

7. The method of claim 1 wherein the first metal gate electrode comprises:
    a first metal that partially fills the first trench, that is 50 angstroms to 1000 angatroms thick, and that is selected from the group consisting of Hf, Zr, Ti, Ta, and Al; and
    an easily polished metal that fills the first trench and that is selected from the group consisting of tungsten and aluminum; and
    wherein the second metal gate electrode comprises a second metal that partially fills the second trench, and that is selected from the group consisting of Ru, Pd, Pt, Co, Ni, TiAlN, and WCN.

8. A process comprising:
    forming an exposed n-type polysilicon structure on a first part of a substrate;
    forming an exposed p-type polysilicon structure on a second part of a substrate;
    removing the exposed n-type polysilicon structure selectively to the exposed p-type polysilicon structure to generate a first trench without masking the exposed p-type polysilicon structure:
    depositing a first metal within the first trench;
    removing the exposed p-type polysilicon structure to generate a second trench; and
    depositing a second metal within the second trench.

9. The method of claim 8 wherein:
    the first metal fills the first trench and is selected from the group consisting of Hf, Zr, Ti, Ta, and Al; and
    the second metal fills the second trench and is selected from the group consisting of Ru, Pd, Pt, Co, Ni, TiAlN, and WCN.

10. The method of claim 9 wherein the exposed n-type polysilicon structure is removed selectively to the exposed p-type polysilicon structure using an ammonium hydroxide etch.

11. The method of claim 10 wherein the ammonium hydroxide etch takes place below 40° C. and at a concentration of 2–29%.

12. The method of claim 11 wherein the exposed p-type polysilicon structure is removed using a wet etch that comprises 20–30% TMAH at 60–90  C.

13. The method of claim 8 wherein the first metal partially fills the first trench and is 50 angstroms to 1000 angstroms thick, and further comprising depositing an easily polished metal on the first metal to fill the first trench.

14. The method of claim 13 wherein the easily polished metal is selected from the group consisting of tungsten and aluminum.

15. The method of claim 14 wherein the second metal only partially fills the second trench.

16. A process comprising: depositing an inter-layer dielectric on an n-type polysilicon structure and on a p-type polysilicon structure;
    removing the inter-layer dielectric from the n-type polysilicon structure and from the p-type polysilicon structure to generate an exposed n-type polysilicon structure and an exposed p-type polysilicon structure;
    removing the exposed n-type polysilicon structure selectively to the exposed p-type polysilicon structure to generate a first trench without masking the exposed p-type polysilicon structure;

depositing a first metal that partially fills the first trench and that is 50 angstroms to 1000 angstroms thick;

depositing an easily polished metal on the first metal to fill the first trench;

removing the exposed p-type polysilicon structure to generate a second trench; and depositing a second metal that partially fills the second trench.

17. The method of claim 16 wherein:

the first metal is selected from the group consisting of Hf, Zr, Ti, Ta, and Al;

the easily polished metal is selected from the group consisting of tungsten and aluminum; and the second metal is selected from the group consisting of Ru, Pd, Pt, Ca, Ni, TiAlN, and WCN.

18. The method of claim 16 wherein the exposed n-type polysilicon structure is removed selectively to the exposed p-type polysilicon structure using an ammonium hydroxide etch that takes place below 40° C. and at a concentration of 2–29%.

19. The method of claim 16 wherein the exposed p-type polysilicon structure is removed using a wet etch that comprises 20–30% TMAH at 60–90° C.

* * * * *

UNITED STATES PATENT AND TRADEMARK OFFICE
CERTIFICATE OF CORRECTION

PATENT NO. : 6,972,225 B2 Page 1 of 1
APPLICATION NO. : 10/946502
DATED : December 6, 2005
INVENTOR(S) : Doczy et al.

It is certified that error appears in the above-identified patent and that said Letters Patent is hereby corrected as shown below:

In column 6, at line 2, delete "Ca," and insert --Co,--.

Signed and Sealed this

Twentieth Day of May, 2008

JON W. DUDAS
*Director of the United States Patent and Trademark Office*